United States Patent
Kaneda

(10) Patent No.: US 8,254,171 B2
(45) Date of Patent: Aug. 28, 2012

(54) NONVOLATILE SEMICONDUCTOR MEMORY

(75) Inventor: Yoshinobu Kaneda, Ora-gun (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 250 days.

(21) Appl. No.: 12/770,374

(22) Filed: Apr. 29, 2010

(65) Prior Publication Data
US 2010/0284223 A1    Nov. 11, 2010

(30) Foreign Application Priority Data
May 7, 2009 (JP) .................................. 2009-112573

(51) Int. Cl.
*G11C 16/04* (2006.01)

(52) U.S. Cl. ......... 365/185.11; 365/230.05; 365/230.03; 365/189.02

(58) Field of Classification Search ............. 365/185.11, 365/230.05, 230.03, 189.02
See application file for complete search history.

(56) References Cited

U.S. PATENT DOCUMENTS

| | | | | |
|---|---|---|---|---|
| 5,844,856 A | * | 12/1998 | Taylor | 365/230.05 |
| 6,346,825 B1 | * | 2/2002 | Pang et al. | 326/40 |
| 7,460,431 B1 | * | 12/2008 | Pan et al. | 365/233.13 |
| 7,499,364 B2 | * | 3/2009 | Ahn et al. | 365/230.05 |

FOREIGN PATENT DOCUMENTS

JP    11-306010    11/1999

* cited by examiner

*Primary Examiner* — Connie Yoha
(74) *Attorney, Agent, or Firm* — Morrison & Foerster LLP

(57) ABSTRACT

The invention decreases the number of writing processes of EEPROM. When a mode change signal is L level, a EEPROM is set to a bank mode. In this case, first and second memory banks are independently accessed by a control signal of a first port and a control signal of a second port, respectively. When the mode change signal is H level, the EEPROM is set to a combine mode. In this case, the first and second memory banks are combined into a 4k-bit memory bank, and accessed by the control signal of the first port.

5 Claims, 6 Drawing Sheets

*FIG.2A* Bank mode
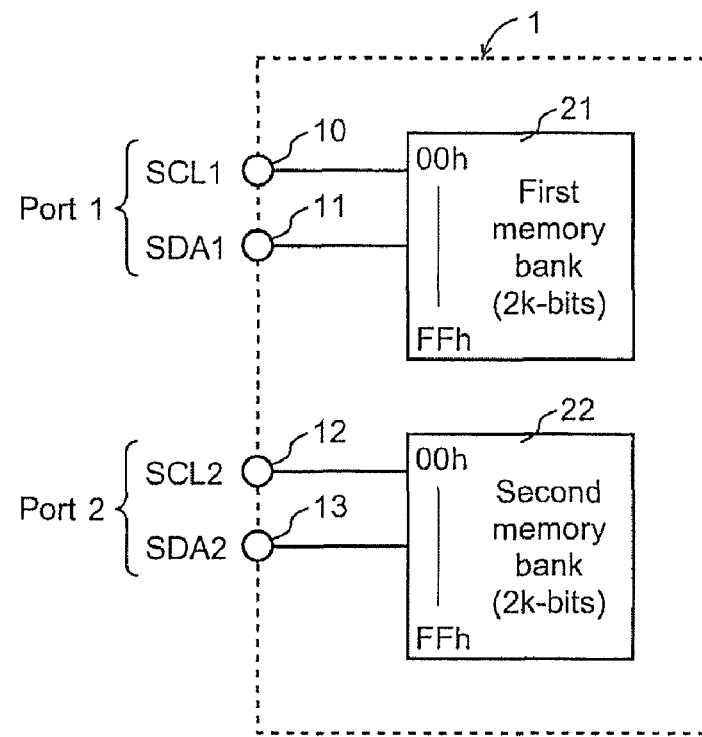
*FIG.2B* Combine mode
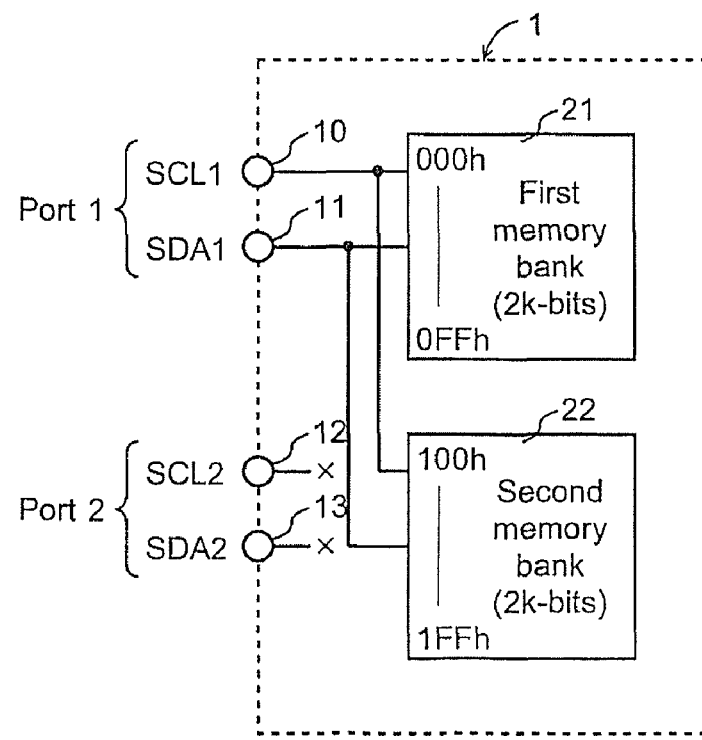

| | Effective address | Slave address |
|---|---|---|
| Bank mode (COMB="L") | A7-A0 | SA2,SA1,SA0 |
| Combine mode (COMB="H") | A8-A0<br>A8=0:Select first memory bank<br>A8=1:Select second memory bank | SA2,SA1<br>but don't care SA2, SA1 |

| | Effective address | Slave address |
|---|---|---|
| Bank mode (COMB="L") | A7-A0 | SB2,SB1,SB0 |
| Combine mode (COMB="H") | — | — |

FIG.5A   Pin position of general 4k-bit EEPROM
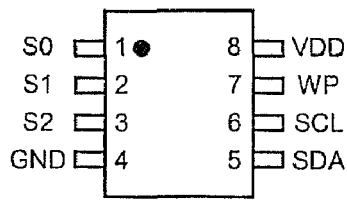
FIG.5B   Pin position of EEPROM 1 of embodiment
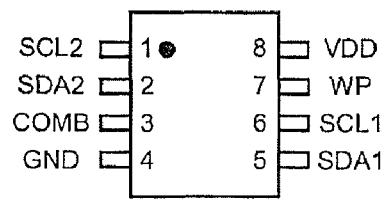
FIG.6
Connection example of ROM writer
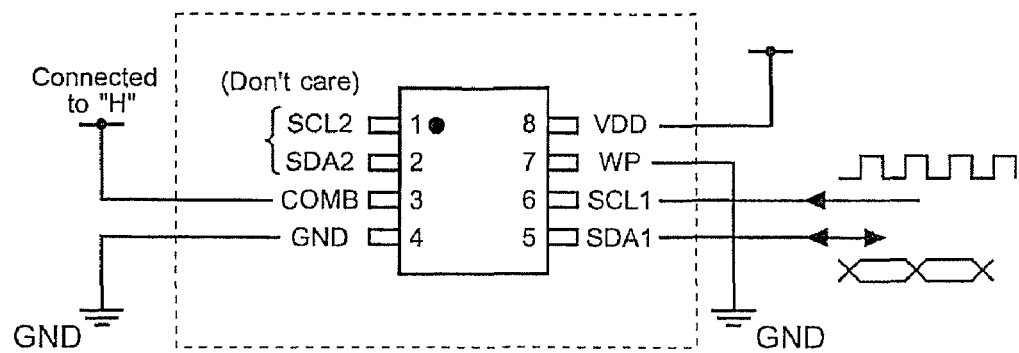

NONVOLATILE SEMICONDUCTOR MEMORY

CROSS-REFERENCE OF THE INVENTION

This application claims priority from Japanese Patent Application No. 2009-112573, the content of which is incorporated herein by reference in its entirety.

BACKGROUND OF THE INVENTION

1. Field of the Invention

The invention relates to an electrically erasable and programmable nonvolatile memory (EEPROM: Electrically Erasable Programmable Read Only Memory), in particular, a dual port EEPROM.

2. Description of the Related Art

A dual port EEPROM is an EEPROM having a plurality of memory banks each of which is accessible independently.

For example, a dual port EEPROM having first and second memory banks has first and second ports. This is configured so that the first memory bank becomes accessible by serially inputting a first control signal (a clock, address data, etc) to the first port and the second memory bank becomes accessible by serially inputting a second control signal (a clock, address data, etc) to the second port.

From a user's point of view, the dual port EEPROM is like one package in which a plurality of EEPROM are mounted, and realizes the independent and simultaneous use of these EEPROM for a plurality of separate systems. A dual port EEPROM is described in Japanese Patent Application publication No. Hei 11-306010.

As described above, in a conventional dual port EEPROM, a plurality of memory banks are independently accessed. Therefore, when data is to be written to each of the memory banks, a control signal need be inputted to each of the ports corresponding the memory banks, thereby causing a large number of processes.

SUMMARY OF THE INVENTION

The invention provides a nonvolatile semiconductor memory that includes a first memory bank having a plurality of electrically writable and readable memory cells, a second memory bank having a plurality of electrically writable and readable memory cells, a first port to which a first control signal is serially inputted, a second port to which a second control signal is serially inputted, a mode change terminal to which a mode change signal is inputted, and a control circuit selecting a first mode in which an access to the first memory bank is enabled in response to the first control signal and an access to the second memory bank is enabled in response to the second control signal when the mode change signal is at a first level and selecting a second mode in which the access to the first memory bank and the access to the second memory bank are enabled in response to the first control signal when the mode change signal is at a second level.

BRIEF DESCRIPTION OF THE DRAWINGS

FIGS. 2A, 2B are diagrams for explaining the operation of the EEPROM of the embodiment of the invention.

FIGS. 5A, 5B are diagrams showing the position of the terminals of the EEPROM.

FIG. 6 is a diagram showing an example of the connection of the EEPROM and a ROM writer of the embodiment of the invention.

DETAILED DESCRIPTION OF THE INVENTION

Hereafter, an embodiment of the invention will be described referring to figures.

[Structure of EEPROM 1]

Figure 1:
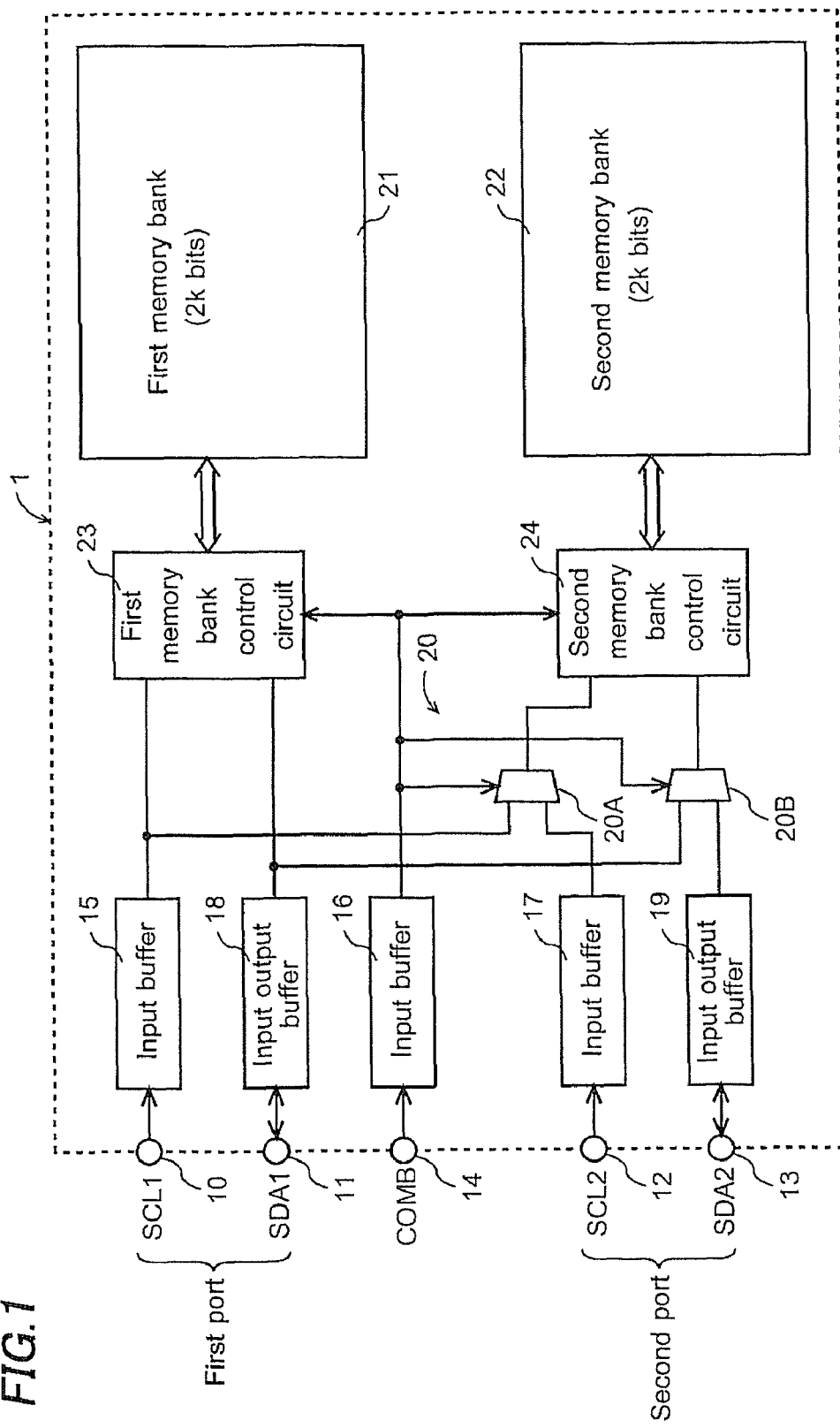
FIG. 1 is a diagram of a structure of an EEPROM of an embodiment of the invention.

FIG. 1 is a diagram showing a structure of an EEPROM 1 of an embodiment of the invention. The EEPROM 1 is an EEPROM using a serial interface method, and has a first clock input terminal 10 to which a first serial clock SCL1 is inputted, a first data input output terminal 11 to which first serial data SDA1 synchronized with the first serial clock SCL1 is inputted and outputted, a second clock input terminal 12 to which a second serial clock SCL2 is inputted, a second data input output terminal 13 to which second serial data SDA2 synchronized with the second serial clock SCL2 is inputted and outputted, and a mode change terminal 14 to which a mode change signal COMB is inputted.

The first clock input terminal 10 and the first data input output terminal 11 form a first port, and the second clock input terminal 12 and the second data input output terminal 13 form a second port.

The EEPROM 1 further has input buffers 15 to 17, input output buffers 18, 19, a mode change circuit 20, a first memory bank 21, a second memory bank 22, a first memory bank control circuit 23 and a second memory bank control circuit 24.

The first and second memory banks 21, 22 are memory regions including a plurality of electrically writable and readable memory cells. Hereafter, the description will be given supposing that the first and second memory banks 21, 22 have 2k-bit (256×8 bits) memory capacitance as an example.

The first memory bank control circuit 23 controls access to the first memory bank 21 based on the first serial clock SCL1 inputted from the first clock input terminal 10 through the input buffer 15 and the first serial data SDA1 inputted from the first data input output terminal 11 through the input output buffer 18.

In detail, in a case of a writing operation, the first memory bank control circuit 23 controls writing data to corresponding addresses according to a writing instruction code, address data and data included in the first serial data SDA1. In a case of a reading operation, the first memory bank control circuit 23 controls reading data stored in corresponding addresses according to a reading instruction code and address data included in the first serial data SDA1 and serially outputting the read data from the first data input output terminal 11 through the input output buffer 18.

The mode change circuit 20 is configured including multiplexers 20A, 20B. When the mode change signal COMB inputted to the mode change terminal 14 is L level (a bank mode), the multiplexer 20A sends the second serial clock SCL2 inputted from the second clock input terminal 12 through the input buffer 17 to the second memory bank control circuit 24, and the multiplexer 20B sends the second serial data SDA2 inputted from the second data input output terminal 13 through the input output buffer 19 to the second memory bank control circuit 24.

The second memory bank control circuit 24 controls access to the second memory bank 22 based on the second serial clock SCL2 and the second serial data SDA2.

On the other hand, when the mode change signal COMB inputted to the mode change terminal 14 is H level (a combine mode), the multiplexer 20A sends the first serial clock SCL1 inputted from the first clock input terminal 10 through the input buffer 15 to the second memory bank control circuit 24, and the multiplexer 20B sends the first serial data SDA1 inputted from the first data input output terminal 11 through the input output buffer 18 to the second memory bank control circuit 24. In this case, the second serial clock SCL2 inputted to the second clock input terminal 12 and the second serial data SDA2 inputted to the second data input output terminal 13 are disabled.

FIGS. 2A and 2B are diagrams schematically showing the operations of the bank mode and the combine mode. As shown in the figure, in the bank mode of FIG. 2A, the first and second memory banks 21, 22 are independently accessed by the control signal (SCL1, SDA1) of the first port and the control signal (SCL2, SDA2) of the second port, respectively. In this case, the EEPROM 1 functions as a general dual port EEPROM, and the addresses of both the first and second memory banks 21, 22 are 00h-FFh, respectively.

In the combine mode of FIG. 2B, the first and second memory banks 21, 22 form a combined 4k-bit memory bank, and are accessed by the control signal (SCL1, DA1) of the first port. In this case, the addresses of the first memory bank 21 are 000h-0FFh, and the addresses of the second memory bank 22 are 100-1FFh. It means that the memory bank to be accessed is changed depending on whether the address data of the most significant bit is "1" or "0". The control signal (SCL2, SDA2) of the second port is disabled.

[Description of operation of EEPROM 1]

In general, in order to perform data communication between a master device and a slave device on a system, the master device generates a start condition to the slave device. In the embodiment, the EEPROM 1 is the slave device.

Following the generation of the start condition, the master device sends serial data including a 7-bit wide device address and a 1-bit wide reading/writing instruction code to the EEPROM 1 through a serial data bus in synchronization with a serial clock, thereby realizing communication with the EEPROM 1.

Figure 3:
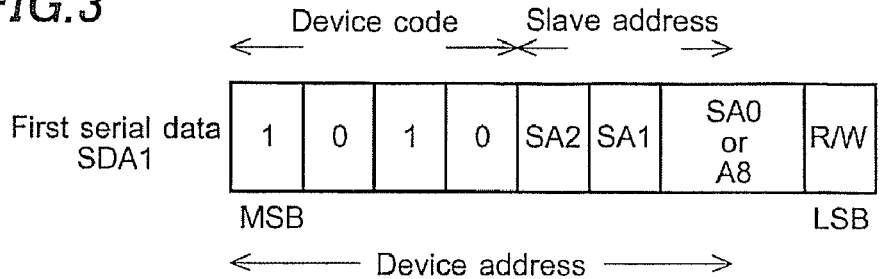
FIG. 3 is a diagram for explaining the operation of the EEPROM of the embodiment of the invention.

FIG. 3 shows a structure of the first serial data SDA1 for the first memory bank 21. As shown in the figure, the upper 4 bits of the device address of the first serial data SDA1 are called a device code, and set to "1010", for example, in the case of the EEPROM 1.

3 bits subsequent to the device code are called a slave address. The slave address of the first memory bank 21 is SA2, SA1 and SA0, and set to SA2=0, SA1=0, and SA0=0 when the EEPROM 1 is shipped. 1 bit subsequent to the slave address corresponds to the reading/writing instruction code (R/W), and this is the reading instruction code when this code is "1" or the writing instruction code when this code is "0". The device code+slave address of the first serial data SDA1 are inputted in the first to eighth serial clock cycles of the first serial clock SCL1, respectively.

Then the first memory bank control circuit 23 detects whether the device code+slave address of the first serial data SDA1 and the device code+slave address set when shipped in the EEPROM 1 correspond. When the first memory bank control circuit 23 detects the correspondence between these, it sends an acknowledge signal back to the master device in the ninth serial clock cycle. The first memory bank control circuit 23 then performs a reading operation or writing operation according to the reading instruction code or writing instruction code (R/W) inputted in the eighth serial clock cycle.

When the mode change signal COMB is L level for the bank mode, 8 bit address data A7 to A0 inputted in synchronization with the tenth to seventeenth serial clocks are effective address data. The first memory bank control circuit 23 performs the reading operation or writing operation for the corresponding addresses of the first memory bank 21 according to these effective address data.

On the other hand, when the mode change signal COMB is H level for the combine mode, 9 bit address data A8 to A0 are effective address data. The first and second memory bank control circuits 23, 24 select the first memory bank 21 when the most significant address data A8=0 or select the second memory bank 22 when A8=1. Although the slave address includes 2 bits of SA2, SA1, the values of SA2, SA1 are ignored in the combine mode. It means that the first memory bank control circuit 23 detects the correspondence only between the device codes.

Figure 4:
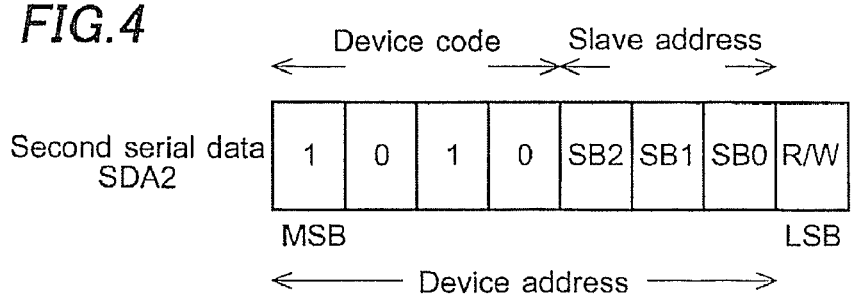
FIG. 4 is a diagram for explaining the operation of the EEPROM of the embodiment of the invention.

FIG. 4 shows a structure of the second serial data SDA2 for the second memory bank 22. The device code of the second serial data SDA2 is set to "1010" similarly. A 3-bit slave address subsequent to the device code is SB2, SB1 and SB0, and set to SB2=0, SB1=0 and SB0=0 when the EEPROM 1 is shipped. 1 bit subsequent to the slave address is a reading/writing instruction code (R/W).

Then the second memory bank control circuit 24 detects whether the device code+slave address of the second serial data SDA2 and the device code+slave address set when shipped in the EEPROM 1 correspond. Then when the second memory bank control circuit 24 detects the correspondence between these, it sends an acknowledge signal back to the master device in the ninth serial clock cycle. Then the second memory bank control circuit 24 performs a reading operation or writing operation according to the reading instruction code or writing instruction code inputted in the eighth serial clock cycle.

When the mode change signal COMB is L level for the bank mode, 8 bit address data A7 to A0 that are inputted in synchronization with the tenth to seventeenth serial clocks are effective address data. The second memory bank control circuit 24 performs the reading operation or writing operation for the corresponding addresses of the second memory bank 22 according to these effective address data. On the other hand, when the mode change signal COMB is H level for the combine mode, the second memory bank 22 is controlled by the first serial clock SCL1 and the first serial data SDA1, and the second serial clock SCL2 and the second serial data SDA2 are disabled.

[Writing by ROM Writer in Combine Mode]

As described above, the EEPROM 1 becomes the combine mode by setting the mode change terminal 14 to H level, achieving the use of the two-bank structure (2k bits+2k bits) as a one-bank structure (4k bits) pseudoly. This realizes writing to the EEPROM 1 by a ROM writer like writing to a general 4k-bit EEPROM.

FIGS. 5A, 5B are diagrams showing the positions of the terminals of the EEPROM. As shown in FIG. 5A, a general 4k-bit EEPROM is a 8-terminal structure, in which a serial clock SCL is assigned to a terminal 6 and serial data SDA is assigned to a terminal 5. Terminals 1 to 3 for a slave address of S0 to S2 are not often used.

Therefore, as shown in FIG. 5B, the second serial clock SCL2 is assigned to the terminal 1, the second serial data SDA2 is assigned to the terminal 2, and the mode change signal COMB is assigned to the terminal 3. Furthermore, the first serial data SDA1 is assigned to the terminal 5, and the first serial clock SCL1 is assigned to the terminal 6.

By thus assigning each of the signals to the corresponding terminals, in the combine mode (COMB=H level), data writing is achieved by using a same ROM writer as for a general 4k-bit EEPROM. In detail, as shown in FIG. 6, the terminal 3 (COMB) is set to H level, the terminal 4 (GND) is grounded, a power supply potential is applied to the terminal 8 (VDD), and the terminal 7 (WP) is grounded. The terminal 7 is a terminal for writing protection, and the writing protect is cancelled by grounding (L level application).

Writing is then achieved by inputting the first serial clock SCL1 to the terminal 6 and inputting the first serial data SDA1 to the terminal 2 from the ROM writer.

Figure 7:
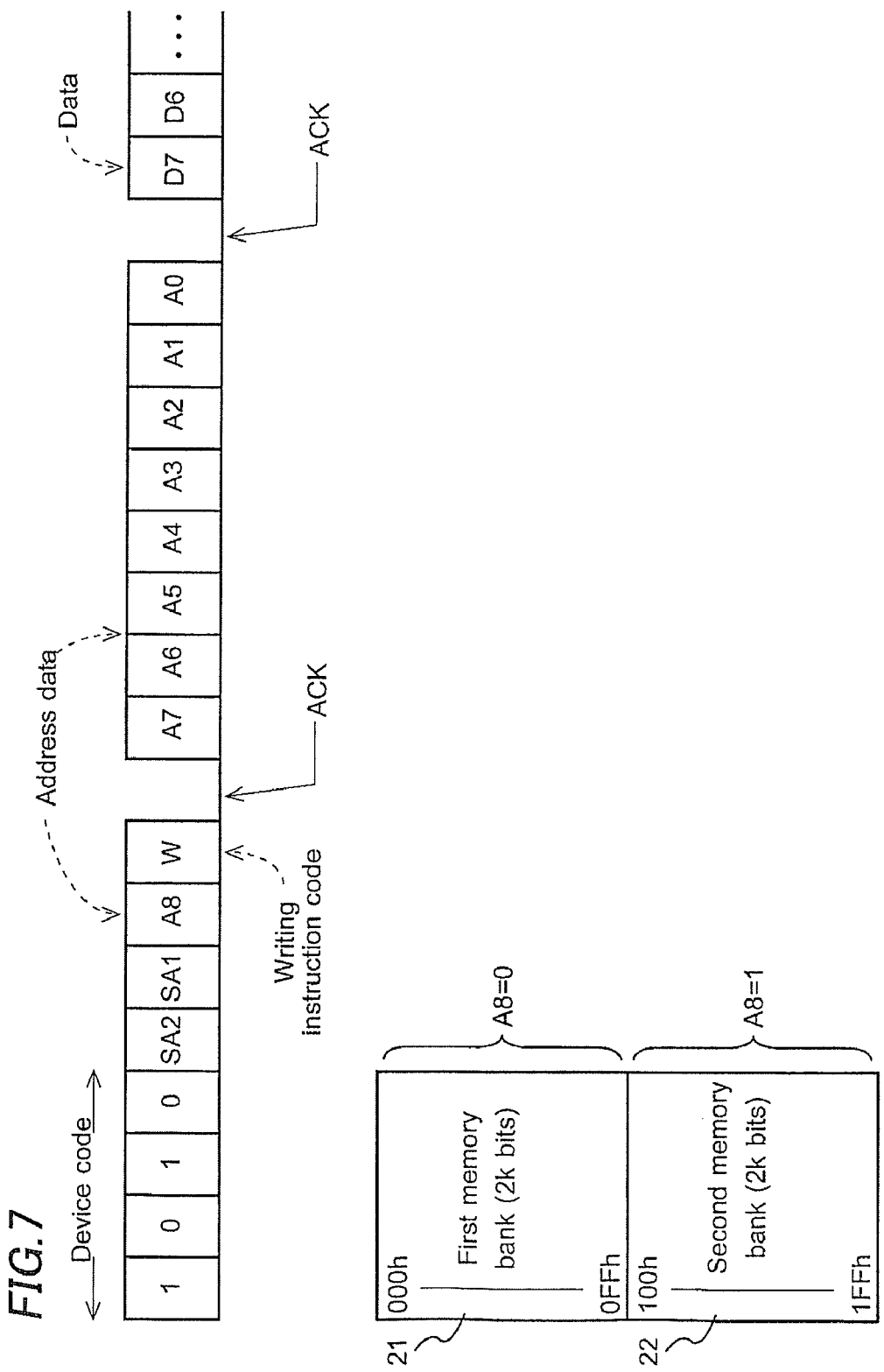
FIG. 7 is a diagram for explaining the writing operation of the EEPROM of the embodiment of the invention.

Next, the details of the writing operation in the combine mode will be described referring to FIG. 7. First, as the upper 4 bits of the first serial data SDA1, the device code is inputted from the ROM writer as a master device. The correspondence between the inputted device code and the device code "1010" the EEPROM 1 originally has is detected. By this, data communication between the ROM writer and the EEPROM 1 is realized. The slave address SA2, SA1 subsequent to this code is ignored.

1 bit subsequent to the slave address SA2, SA1 is address data A8 of the most significant bit. The first memory bank 21 is selected when A8=0, or the second memory bank 22 is selected when A8=1.

1 bit subsequent to the address data A8 is a writing instruction code W (=0). When the writing instruction code W is inputted, the EEPROM 1 sends an acknowledge signal ACK back to the ROM writer. Then address data A7 to A0 are serially inputted from the ROM writer to the EEPROM 1. The EEPROM 1 sends an acknowledge signal ACK back to the ROM writer when the inputting of the address data A7 to A0 is completed. Then data D7 to D0 are serially inputted from the ROM writer to the EEPROM 1. By this, the data D7 to D0 are written to the addresses specified by the address data A7 to A0.

In the bank mode, the data D7 to D0 thus written to the first and second memory banks 21, 22 are read out from the first memory bank 21 in response to the control signal (SCL1, SDA1) inputted to the first port, and read out from the second memory bank 22 in response to the control signal (SCL2, SDA2) inputted to the second port.

As described above, the EEPROM 1 has the normal bank mode and the combine mode. In the combine mode the first and second memory banks 21, 22 are combined into one 4k-bit memory bank, and accessed by the control signal (SCL1, DA1) of the first port. This decreases the number of data writing processes. Furthermore, the EEPROM 1 is pin-compatible with a general 4k-bit EEPROM and writing is performed from the same terminals, so that a ROM writer used for writing to a general 4k-bit EEPROM is used as it is.

[Example of System Structure Using EEPROM 1]

Figure 8:
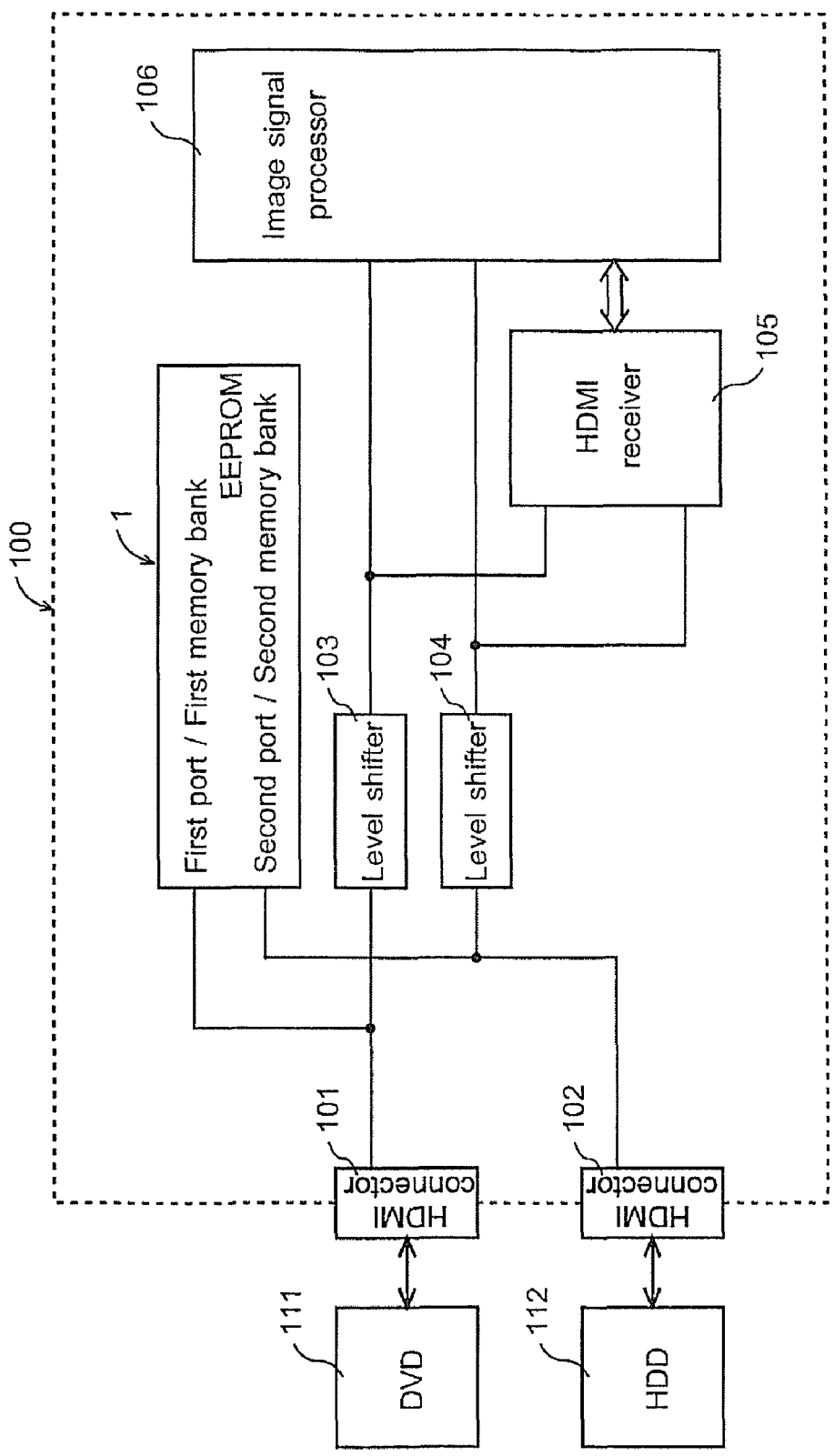
FIG. 8 is a diagram of a system structure of a display device having HDMI connectors.

FIG. 8 is a diagram of a system structure of a display device 100 such as a liquid crystal display TV etc having HDMI connectors. The HDMI is the abbreviation of a high definition multimedia interface.

The display device 100 is configured including two HDMI connectors 101, 102, the dual port EEPROM 1 having a port 1 and a port 2, two level shifters 103, 104, an HDMI receiver 105, and an image signal processor 106. A DVD 111 (Digital Video Disc) as an external recording medium is connected to the HDMI connector 101, and a HDD 112 (Hard Disk Drive) is connected to the HDMI connector 102, for example.

The HDMI connectors 101, 102 are known as interfaces that are effective for high resolution image display since these output a digital signal as it is and do not cause image degradation. The HDMI connectors 101, 102 are connected to the first port and second port of the EEPROM 1 through serial data buses, respectively. In this case, display information about the resolution or input signal type of the display device 100 is written to the EEPROM 1 by using the combine mode described above. Furthermore, the HDMI connectors 101, 102 are connected to the HDMI receiver 105 and the image signal processor 106 through the level shifters 103, 104, respectively.

The operation of this display device 100 will be described. First, when the power is turned on, the display information stored in the EEPROM 1 is read out from each of the first port and the second port, and sent to the DVD 111 and the HDD 112 through the HDMI connectors 101, 102, respectively.

When image data stored in the DVD 111 is to be displayed on the display device 100, the DVD 111 outputs image data and image control data from the first port based on the display information received from the EEPROM 1.

The image data outputted from the DVD 111 is received by the HDMI receiver 105 through the HDMI connector 101 and the level shifter 103, amplified, and then inputted to the image signal processor 106. Furthermore, the image control data is inputted to the image signal processor 106 through the HDMI connector 101 and the level shifter 103. Then the image signal processor 106 processes the image control data and the image data, and displays the image on the display. When the image data stored in the HDD 112 is to be displayed on the display device 100, the processes are the same as above.

As described above, since one EEPROM 1 stores the display information for the two HDMI connectors 101, 102, the number of components for the display information memory is decreased to the half. Furthermore, since the first and second memory banks 21, 22 are combined into one memory bank to write the display information by using the combine mode, the number of writing processes of EEPROM 1 is decreased.

Although the EEPROM 1 of the embodiment has the first and second memory banks 21, 22, the EEPROM 1 may have three or more memory banks. In this case, in the bank mode, these memory banks are independently accessed by the corresponding ports, respectively. In the combine mode, the plurality of memory banks are combined into one memory bank, and accessed by a control signal from one port. The memory capacitance of each of the memory banks is variable.

What is claimed is:

1. A nonvolatile semiconductor memory comprising:
   a first memory bank comprising a plurality of electrically writable and readable memory cells;
   a second memory bank comprising a plurality of electrically writable and readable memory cells;
   a first port to which a first control signal is serially inputted;
   a second port to which a second control signal is serially inputted;
   a mode change terminal to which a mode change signal is inputted; and
   a control circuit selecting a first mode in which an access to the first memory bank is enabled in response to the first control signal and an access to the second memory bank is enabled in response to the second control signal when the mode change signal is at a first level and selecting a second mode in which the access to the first memory bank and the access to the second memory bank are enabled in response to the first control signal when the mode change signal is at a second level, wherein in the second mode, the first control signal is modified to address both the first memory bank and the second memory bank as one memory.

2. The nonvolatile semiconductor memory of claim 1, wherein the control circuit comprises a first control circuit controlling the access to the first memory bank, a second control circuit controlling the access to the second memory bank, and a mode change circuit which sends the first control signal to the first control circuit and the second control signal to the second control circuit in the first mode and which sends the first control signal to both the first and second control circuits and disables the second control signal in the second mode.

3. The nonvolatile semiconductor memory of claim 1, wherein the first control signal comprises a first serial clock and first serial data synchronized with the first serial clock, and the second control signal comprises a second serial clock and second serial data synchronized with the second serial clock.

4. The nonvolatile semiconductor memory of claim 2, wherein the first control signal comprises a first serial clock and first serial data synchronized with the first serial clock, and the second control signal comprises a second serial clock and second serial data synchronized with the second serial clock.

5. The nonvolatile semiconductor memory of claim 3, wherein 1-bit address data is added to the first serial data in order to access both the first and second memory banks in the second mode, and the control circuit enables the access to the first memory bank when the added address data is a first value and enables the access to the second memory bank when the added address data is a second value in the second mode.

* * * * *